(12) United States Patent
Vilain

(10) Patent No.: US 6,753,526 B2
(45) Date of Patent: Jun. 22, 2004

(54) RADIATION DETECTORS AND METHODS FOR MANUFACTURING THEM

(75) Inventor: Michel Vilain, Saint-Georges-de-Commiers (FR)

(73) Assignee: Commissariat a l'Energie Atomique, Paris (FR)

( * ) Notice: Subject to any disclaimer, the term of this patent is extended or adjusted under 35 U.S.C. 154(b) by 22 days.

(21) Appl. No.: 10/103,403

(22) Filed: Mar. 20, 2002

(65) Prior Publication Data

US 2002/0175284 A1 Nov. 28, 2002

(30) Foreign Application Priority Data

Mar. 21, 2001 (FR) .............................. 01 03820

(51) Int. Cl.⁷ .............................. G01J 5/00; G01J 5/08
(52) U.S. Cl. ............... 250/338.1; 250/332; 250/339.02; 438/69; 332/434
(58) Field of Search ......................... 250/338.1, 339.02, 250/332, 338.4, 339.03, 338.3; 438/57, 66, 69, 73; 257/431, 432, 433, 434

(56) References Cited

U.S. PATENT DOCUMENTS

| | | | |
|---|---|---|---|
| 4,516,027 A | * 5/1985 | Schimmelpfennig et al. | .... 250/338.3 |
| 5,177,661 A | 1/1993 | Zavracky et al. | |
| 5,369,544 A | 11/1994 | Mastrangelo | |
| 5,627,112 A | * 5/1997 | Tennant et al. | ............. 438/113 |
| 5,895,233 A | * 4/1999 | Higashi et al. | ............. 438/107 |
| 5,914,488 A | * 6/1999 | Sone | ...................... 250/338.1 |
| 5,939,722 A | 8/1999 | Werner et al. | |
| 6,080,988 A | * 6/2000 | Ishizuya et al. | ......... 250/338.1 |
| 6,252,229 B1 | * 6/2001 | Hays et al. | ............... 250/338.4 |
| 6,329,655 B1 | * 12/2001 | Jack et al. | ................ 250/338.1 |
| 6,548,879 B2 | * 4/2003 | Komobuchi et al. | ........ 257/431 |
| 6,559,447 B2 | * 5/2003 | Wood | ......................... 250/332 |
| 6,586,831 B2 | * 7/2003 | Gooch et al. | ................ 257/704 |

FOREIGN PATENT DOCUMENTS

| | | |
|---|---|---|
| DE | 197 52 208 A1 | 6/1999 |
| EP | 0 453 372 A1 | 10/1991 |
| EP | 0 624 900 A2 | 11/1994 |

* cited by examiner

Primary Examiner—Albert Gagliardi
(74) Attorney, Agent, or Firm—Brinks Hofer Gilson & Lione

(57) ABSTRACT

The present invention relates to a method of manufacturing radiation detectors, in which these detectors each comprise a set of microdetectors, for example microbolometers, situated under a window that is transparent to said radiation. According to the invention, said detectors are manufactured collectively on a substrate (1), and said method comprises notably the following steps:

- the construction of several layers, of which, for each of said detectors, at least one layer (4) is transparent to said radiation and serves as a window, and
- the partial elimination of said layers principally under said transparent layer(4), such that said microdetectors (2) are placed, for each of said detectors, in one or more cavities, which are then placed under vacuum or under low pressure.

The invention also relates to various radiation detectors, of which the walls form hermetically sealed cavities each containing one or more microdetectors (2).

18 Claims, 17 Drawing Sheets

RADIATION DETECTORS AND METHODS FOR MANUFACTURING THEM

FIELD OF THE INVENTION

The invention relates to the manufacture of radiation detectors comprising a set of individual "microdetectors" arranged in matrices or line arrays. The invention is particularly advantageous in the case where these microdetectors are microbolometers.

BACKGROUND

A bolometer is a device designed to transform the radiation to which it is subjected, typically in the infrared range, into thermal energy. The resulting heating of the bolometer gives rise to the variation in an electrical property, for example the electrical resistance of a conductor connected to a circuit exterior to the bolometer. In the case of a detector comprising an array of microbolometers, said electric circuit, known as a "reading" circuit, manages the array addressing functions and the reading stimuli sent to each microbolometer, and converts the resulting signals into a format exploitable for imaging (for example in the form of a video signal). To obtain the best possible performance, the microbolometers are made to operate under relatively low gas pressure (or under moderate pressure of a gas having low thermal conductivity), in order for the thermal dissipation due to this gas to be negligible in relation to the inherent thermal conductance of the bolometers.

Typical methods of manufacture of detectors of this type comprise initial steps carried out directly on the surface of an electronic circuit, in a so-called monolithic manner (i.e. in a continuous sequence of operations on the same substrate, usually of silicon) or hybrid manner (with transfer onto a substrate of prefabricated elements). These steps involve common techniques of the microelectronics industry, in particular techniques of collective production, typically concerning several tens to several hundreds of detectors deposited onto the same substrate (wafer level). During these steps the components that are actually bolometric (optical absorption, and resistance variable with temperature) are mounted on the surface of a layer that is "sacrificial" in the sense that this layer (usually made of polyimide, of polycrystalline silicon, or of metal such as copper or aluminum) is eliminated at the end of the process (by combustion in an oxygen plasma, for example), so as to leave the structures of the bolometer suspended above the substrate.

Further to these initial steps, an automated quality test and sorting operation are performed, then the assembly is cut up into individual detectors. The process of manufacture ends with a so-called "unitary" set of operations, that is to say carried out on each detector individually.

These unitary operations typically comprise the following steps:

The first step is the "freeing" of the microbolometers, which consists in eliminating at least a part of the sacrificial layers. This operation leads to the structures being extremely vulnerable mechanically. Moreover, the slightest contamination by dust (so-called "particulate" contamination) of size greater than a few micrometers also deteriorates the detector locally, since cleaning cannot be envisaged, in any manner, due to the risk of complete destruction: more particularly, the freed microbolometers can withstand neither blowing, nor wetting nor contact.

Next, each detector is glued or soldered to a ceramic die carrier, this die carrier being itself usually glued or soldered onto a system of thermal regulation (Peltier element), and the detector is connected by wire bonding. This assembly is next mounted into a casing comprising at least two parts: a metallic or ceramic die carrier, and a cover comprising a window transparent to infrared radiation. Before sealing of said cover, the electric inputs and outputs of the casing are connected to the metallic tracks of the ceramic, again by wire bonding. The assembly and the number of operations may be optimized, but, as may be seen, this remains very complex overall.

Finally, for the systems of highest performance, before sealing the cover a "getter" is placed within the casing. A getter is constituted by a material known for its capacity to improve the quality of the vacuum (for example iron, titanium, vanadium, cobalt, aluminum, zirconium or manganese, or an alloy of these metals).

All these unitary operations, associated with the supply cost of the elements and components making up the casing, result in an additional manufacturing cost which is considerably higher than the cost of collective manufacture of the detectors. This end of manufacturing cost (after the collective operations) is particularly high in the case of microbolometer imaging systems (it commonly attains 60 to 70% of the cost of the final component), since the level of residual pressure required for optimal operation of the detector (typically of the order of $10^{-2}$ mbar) requires a high quality of vacuum sealing. This justifies the implementation of unitary techniques developed on specific casings (use of vents or evacuation pipes), and a relatively long cycle (several hours) of degasification and activation of the getter. Furthermore, the operations of testing and sorting of the products in course and/or at the end of manufacture are themselves unitary, and very difficult to automate.

It may thus be seen, in relation to the manufacture of detectors comprising arrays of microbolometers, that conventional techniques suffer from a low rate of production, and a high overall cost.

The object of U.S. Pat. No. 5,895,233 is specifically to improve the state of the art in this field. This document provides a collective technique for the production of covers on substrates of conventional dimensions which will be referred to as "window substrates", and a technique, also collective, of sealing each window substrate onto a "detector substrate", the two substrates being held at a certain distance from each other by means of solder beads so as to ensure the mechanical protection of the detector under vacuum.

This technique has several drawbacks. First of all, the soldering of the cover over the detector substrate is difficult to manage. Furthermore, the creation of the vacuum requires the use of getters of large size if an ordinary soldering apparatus is used, or otherwise a high technology vacuum soldering apparatus. Furthermore, this technique requires the use of relatively thick materials (several hundreds of microns) to produce the "window substrate", which limits the optical transparency, and therefore the performance of the detector. Another drawback is that the solder beads occupy a large surface area of the detector substrate, which means that only detectors of large size can be economically worthwhile; but in the case of large detectors, flexing of the two parts of the casing is observed under the effect of the external atmospheric pressure, which gives rise to geometrical aberration, and can even lead the window to come into contact with the microbolometers, in which case the detector is destroyed; to alleviate this problem, the document proposes to arrange a pillar within the casing, but this means that another part of the detector is made blind.

BRIEF SUMMARY

To solve these problems, the invention provides a method of manufacture of radiation detectors, in which the detectors each comprise an assembly of microdetectors, for example microbolometers, under a window that is transparent to said radiation, said method being remarkable in that said detectors are manufactured collectively on a substrate, and in that it comprises notably the following steps:

the construction of several layers, of which, for each of said detectors, at least one layer is transparent to said radiation and serves as a window, and the partial elimination of said layers principally under said transparent layer, such that said microdetectors are placed, for each of said detectors, in one or more cavities, which are then placed under vacuum or under low pressure.

Thus, the detectors according to the invention comprise, due to their actual construction, the elements adapted to keeping the microdetectors under vacuum. Advantageously, this construction according to the invention may use "microelectronics" techniques, that is to say all the techniques of micro-manufacturing such as the deposit and etching of layers.

According to particular features, said steps of construction and partial elimination of layers leads to the formation of a peripheral partition surrounding each of said detectors.

Thus, whatever dimensions have been chosen for the detector, there will be no loss of lateral space at the periphery to obtain a finished and protected component. The method according to the invention is thus equally attractive from an economic point of view for small detectors as for detectors of large dimension.

According to particular features, said step of partial elimination of layers is carried out through one or more openings formed in the envelope of each of said detectors. Preferably, said openings will be formed in said transparent layer, in order to facilitate the provision of these openings.

By virtue of these arrangements, the cross-construction of said cavities containing the microdetectors is particularly simple, and only requires conventional microelectronics techniques.

Preferably, said step consisting of creating a vacuum or a low pressure in the cavities will be carried out through said openings. Moreover, during said steps of construction and partial elimination of layers, the formation of a surface will be provided within the cavities, opposite each of said openings, serving as a support for a material capable of sealing said openings in order to seal said cavities.

By virtue of these provisions, the "seals" are held in place, and the spreading of said sealing material within the cavities is avoided.

The invention also relates to various devices.

It thus relates, firstly, to a radiation detector manufactured by means of one of the methods succinctly described above.

The invention relates, secondly, to a radiation detector comprising an assembly of microdetectors, for example microbolometers, said detector being remarkable in that it further comprises a portion of substrate, a peripheral partition surrounding said detector and joined to said portion of substrate, and a wall adapted to serve as a window for said radiation and joined to said peripheral partition, said portion of substrate, said peripheral partition and said wall forming an envelope for said detector, within which are located one or more cavities containing said microdetectors under vacuum or under low pressure.

The invention relates, thirdly, to a radiation detector comprising an assembly of microdetectors, for example microbolometers, placed under vacuum or under low pressure in one or more cavities located within the envelope of said detector, said detector being remarkable in that said envelope comprises a portion of substrate, and a wall adapted to serve as a window for said radiation, and in that said envelope has one or more openings sealed using a suitable material.

It will be noted that the devices according to the invention may be entirely manufactured using microelectronics techniques, that is to say in environments which give rise to very low levels of polluting particles, and that, moreover, the finished device may be cleaned by conventional techniques in case of need, during or after the final operations of soldering of the connections, or of soldering and gluing on the final support. Due to this the manufacturing yield is high.

According to particular features, the radiation detector comprises, on the one hand, a peripheral partition, and, on the other hand, either a network of partitions, or a network of internal pillars, said window being joined to said peripheral partition and to said internal pillars or partitions.

By virtue of these provisions, it is not necessary to modify the production technique to adapt it to the dimensions of the detector, as was the case in the prior art using a cover. The mechanical effort due to atmospheric pressure is compensated for by the internal pillars and/or partitions, independently of the dimensions of the detector.

Furthermore, the window may be of small thickness, which naturally leads to a high level of optical transparency, favorable to optimal performance.

According to particular features, some selected internal surfaces of the cavities are covered with a getter.

More particularly it may in this manner be useful to improve the durability of the interior vacuum, which is necessary in order to maintain the optimal characteristics of the bolometers. Although the technique of producing and sealing the cavities according to the invention makes it possible to achieve a sufficient level of vacuum without the use of getters, the person skilled in the art may consider, in certain circumstances, given the specifications aimed at (in particular concerning the longevity of the microdetectors), that the surface/volume ratio of the cavities so obtained is too high.

Once the manufacturing has been completed according to these provisions, the assembly is subjected to automatic electro-optical test and sorting operations, then is cut up into individual chips.

It will be noted in this connection that it is possible, by virtue of the invention, to implement these operations in an automated manner, directly at wafer level, and before cutting up into individual detectors; this is very advantageous in relation to conventional methods, in which these test operations are performed on individual detectors integrated into casings. All the unitary operations according to the prior art described above are thereby eliminated. The invention thus enables considerable savings to be achieved.

The detector can be used 'as is', like any microelectronics chip at this stage of elaboration. It is thus virtually possible to apply all the methods of integration to more complex systems in use in industry, provided that the mechanical and chemical aggressions during the process and the implementation are compatible with the relative superficial mechanical vulnerability of the detector in relation to the optical surface.

Said individual chips may be treated in various manners.

According to a first use of the chips according to the invention, they are integrated directly into their final site of implementation ("bare chips").

It is nevertheless necessary to take care that the component is treated in a manner compatible with its relative fragility, which depends on the nature and thickness of the window as well as on the spacing between successive internal pillars or partitions; more particularly, the less the spacing, the less the chip will be vulnerable as regards the window, for a constant thickness of this window.

According to a different use of the detectors according to the invention, they are integrated by soldering or welding in a casing provided with a window that is transparent to the radiation that it is sought to detect (and possibly provided with Peltier modules for the thermal stabilization). This casing is next used like any casing of a conventional device adapted for the detection of radiation.

Although the use of individual casings implies an additional cost (in exchange for an increased level of protection for the chips), it will be noted that the casings have no need for particularly strict specifications for air-tightness, as was the case in the state of the art. The usual specifications of casings for visible imaging, already widely distributed and thus relatively cheap, are adequate. It is sufficient to specify a window that is transparent to the wavelengths to be detected.

Finally the invention relates to diverse measurement or observation apparatus incorporating at least one radiation detector such as those succinctly described above. These apparatus may for example be imaging systems operating in the infrared range.

Other aspects and advantages of the invention will emerge from a reading of the following detailed description of particular embodiments, given by way of non-limiting example. This description refers to the accompanying drawings, in which:

BREIF DESCRIPTION OF THE DRAWING

FIG. 1 is a view from above of the assembly obtained after a first step in the collective manufacture of detectors, a step which is common to the prior art, FIG. 1b is a section view on A—A of the assembly shown in FIG. 1a, FIG. 2a is a view from above of the assembly obtained after a second step in the collective manufacture of detectors according to a first embodiment of the invention, FIG. 2b is a section view on A—A of the assembly shown in FIG. 2a, FIG. 3a is a view from above of the assembly obtained after a third step in the collective manufacture of detectors according to the first embodiment of the invention, FIG. 3b is a section view on A—A of the assembly shown in FIG. 3a, FIG. 4a is a view from above of the assembly obtained after a fourth step in the collective manufacture of detectors according to the first embodiment of the invention, FIG. 4b is a section view on A—A of the assembly shown in FIG. 4a, FIG. 5a is a view from above of the assembly obtained after a fifth step in the collective manufacture of detectors according to the first embodiment of the invention, FIG. 5b is a section view on A—A of the assembly shown in FIG. 5a, FIG. 6a is a view from above of the assembly obtained after a sixth and final step in the collective manufacture of detectors according to the first embodiment of the invention, FIG. 6b is a section view on A—A of the assembly shown in FIG. 6a, FIG. 7 shows a substrate 1 on which a certain number of detectors have been constructed according to the first embodiment of the invention, FIG. 8 is a diagrammatic section view of a detector according to a first embodiment of the invention, FIG. 9a is a view from above of the assembly according to the first embodiment of the invention, showing a variant making use of "getters", FIG. 9b is a section view on A—A of the assembly shown in FIG. 9a, FIG. 10 is a section view of the assembly according to the first embodiment of the invention, showing another variant making use of "getters", FIG. 11a is a view from above of the assembly obtained after a second step in the collective manufacture of detectors according to a second embodiment of the invention, FIG. 11b is a section view on A—A of the assembly shown in FIG. 11a, FIG. 12a is a view from above of the assembly obtained after a third step in the collective manufacture of detectors according to the second embodiment of the invention, FIG. 12b is a section view on A—A of the assembly shown in FIG. 12a, FIG. 13a is a view from above of the assembly obtained after a fourth step in the collective manufacture of detectors according to the second embodiment of the invention, FIG. 13b is a section view on A—A of the assembly shown in FIG. 13a, FIG. 14a is a view from above of the assembly obtained after a fifth step in the collective manufacture of detectors according to the second embodiment of the invention, FIG. 14b is a section view on A—A of the assembly shown in FIG. 14a, FIG. 15a is a view from above of the assembly obtained after a sixth and final step in the collective manufacture of detectors according to the second embodiment of the invention, FIG. 15b is a section view on A—A of the assembly shown in FIG. 15a, FIG. 16 shows a substrate 1 on which a certain number of detectors have been constructed according to the second embodiment of the invention, FIG. 17a is a diagrammatic perspective view of a detector according to the invention, FIG. 17b is a diagrammatic section view of a detector according to the invention, FIG. 18a is a view from above of the assembly according to the second embodiment of the invention, showing a variant making use of "getters", FIG. 18b is a section view on A—A of the assembly shown in FIG. 18a, and FIG. 19 is a section view of the assembly according to the second embodiment of the invention, showing another variant making use of "getters", FIG. 20 is a sectional view of an observation apparatus including a casing housing a radiation detector arranged in accordance with the invention.

DETAILED DESCRIPTION OF PREFERRED EMBODIMENTS

FIGS. 1a and 1b show respectively a view from above and a partial section of the assembly in a state of configuration and elaboration compatible with the application of the invention.

At the start, electronic circuits (not shown) are present in a substrate 1, which are capable of supplying, on the one hand, the reading stimuli of the microbolometers 2, and on the other hand the processing of the signal resulting from the illumination of these microbolometers 2 through an adapted objective.

The microbolometers 2 are arranged conventionally so as to form a matrix or line array. The usual dimensions of an individual bolometer 2 in each direction parallel to the substrate 1 is ordinarily of the order of 20 to 50 $\mu$m. It is not necessary in the context of this invention to detail the manufacture of these elements. It will simply be observed that they are usually carried out with the use of the parts 2A (pillars or similar structures) extending substantially vertically which are adapted to maintain the upper parts 2B spaced apart from the substrate 1, for reasons of thermal insulation, and subsidiarily for reasons of optical optimization. Part 2B contains the structures for infrared detection.

As mentioned in the introduction, these parts 2B are usually produced on the surface of a "sacrificial" layer 5a. By virtue of this method of production, it is possible to keep the spacing between two neighboring bolometers to a minimum amount, so as to enable their physical and electrical separation to be achieved with a maximum fill factor.

Nevertheless, the structural details of the bolometers 2 shown in the Figures are not particular to the invention, and are only presented by way of example; in particular, to simplify the present description it will be assumed that each microbolometer has no part in common with the neighboring bolometers. In the other cases, the person skilled in the art will know how to adapt the manufacturing steps using his ordinary skills.

The method of manufacture will be assumed to have been carried out until the moment when said layer 5A could be eliminated according to the usual art. However, according to the invention, this layer will be kept for a certain number of steps of the manufacturing method.

The subsequent steps in the manufacture of detectors according to a first embodiment of the invention will now be described. The operations thus forming a second step of this embodiment are the following:

First of all using conventional means a second sacrificial layer 5B is deposited, of a material that is preferably identical, or at least analogous, to that of layer 5A. Preferably polyimide will be used, which will be re-cured in the usual manner in order to withstand the rest of the process. The thickness of this layer will preferably be of the order of 1 to 3 $\mu$m.

Next etching is carried out, in a manner that is preferably substantially vertical, of this layer 5B and the underlying layer 5A by conventional Reactive Ionic Etching (RIE) means, using a first lithographic mask 6.

It may be advantageous, in order to facilitate the assembly, to use a hard mask (not shown), usually constituted by a layer of aluminum, or silicon dioxide $SiO_2$, or else of silicon nitride $Si_3N_4$, deposited according to a method adapted to each material. This known technique facilitates the production of etchings that are substantially vertical, which makes it possible to advantageously limit the width of the grooves obtained after etching to values usually between 0.5 and 2 $\mu$m. This hard mask could advantageously be left on the surface of the layer 5B for the rest of the operations.

FIGS. 2a and 2b show respectively a view from above and a partial section of the assembly, after elimination of the lithographic mask (and, if appropriate, of the hard mask).

Next there is deposited over all of the structure a layer 3 constituted by a mineral material (metallic or dielectric) such as titanium, titanium nitride, tungsten, tungsten silicide, silicon dioxide $SiO_2$, silicon nitride $Si_3N_4$, or amorphous silicon. The thickness (preferably between 0.1 and 1 $\mu$m) and the nature of the material, as well as the method of deposition (for example Low Pressure Chemical Vapor Deposition), will be chosen so as to best fill the grooves. A stack of several layers of different kinds can also be used.

The mask 6 will preferably comprise at least one continuous linear opening that forms a closed figure, so as to trace the peripheral limits of the zones destined to constitute the detectors 100. The etching of the layer 5B will continue through the layer 5A, such that the peripheral pattern produces a groove opening onto the surface of the substrate 1.

The third manufacturing step is then carried out.

Layer 3 is first etched using a second lithographic mask 7, following a contour such as that shown on FIG. 3a.

After etching, the residual pattern preferably covers all the grooves produced at the preceding step, and keeps surfaces of reduced extent (in relation to the surface of a microbolometer). These surfaces are advantageously kept directly in register with zones that are not optically sensitive of each microbolometer, as shown in FIG. 3b, so as to not mask the optically sensitive zones.

Beyond the periphery of the detector 100, the layer 3 will preferably be eliminated by etching, as shown.

If the hard mask of the preceding step has been kept, an easier stopping of the etching of layer 3 on layer 5B results from this. This third step will be terminated by the self-aligned etching of this hard mask, in order to clear the surface of the layer 5B.

The fourth manufacturing step is then carried out.

A third sacrificial layer 5C is deposited, of a material preferably identical, or at least analogous to that of the layers 5A and 5B, and preferably of polyimide, which will also be re-cured in the usual manner in order to withstand the rest of the process. The thickness of this layer will preferably be of the order of 0.2 to 1 $\mu$m.

Next, this layer 5C is etched by conventional Reactive Ionic Etching (RIE) means, using a third lithographic mask 8, of which the outline is shown on FIG. 4a.

After elimination of the lithographic mask, a window 4 is deposited on the surface of layer 5C, as shown in FIG. 4b. The surfaces defined by the mask 8 constitute temporary bearing points for the window on the structure.

It will be noted that these bearing points may be very numerous per unit surface area without loss in the quality of the detector, provided that their arrangement is judiciously chosen. These bearing points will be advantageously disposed in a regular and closely spaced manner (for example one per bolometer, as shown in FIG. 4a).

The materials making up window 4 will naturally be chosen to be transparent to the radiation to be detected by the bolometers positioned below. The possibility will also be considered of employing anti-reflective layers on one or both faces of this element. A main layer will for example be chosen of amorphous silicon (refractive index close to 4 in the infrared range) associated with two layers (above and below it) of silicon nitride $Si_3N_4$ (index close to 2). By adjusting the thickness of these diverse layers judiciously, a window will be obtained that is practically transparent for wavelengths between about 8 and 14 $\mu$m. The total thickness of the window 4 will preferably be between about 0.1 $\mu$m and several $\mu$m.

The device can thus be optimized advantageously by situating the window 4 at a judiciously chosen height above the plane of the microbolometer 2, in order to improve the energy captured by the latter by virtue of stationary waves created in the upper cavity, between the bolometer and the window. This adjustment is achieved by adjusting the thicknesses of the layers 5B and 5C.

The fifth manufacturing step is then carried out.

The window 4 is etched in a known manner, using a fourth lithographic mask 9 shown on FIG. 5a. Layer 4 will preferably be eliminated beyond the limits of the detector 100.

As FIG. 5b shows, this mask 9 protects the window 4 over the most part of its surface, penetrates slightly within the contact zones (obtained previously with the use of the mask 8) between the layers 3 and 4, and preferably defines openings 13 joining these contact zones.

Next all the sacrificial polyimide layers 5A, 5B and 5C, are eliminated, for example using a process under oxygen plasma, according to techniques that are well known to the person skilled in the art.

It will be noted that each microbolometer 2 is now surrounded by partitions 3D and, the case arising, with partitions 3B located at the periphery of the detector 100, all the partitions being joined to the substrate 1.

The grooves formed earlier using the mask 9 connect the exterior environment to the structures contained in the cavities defined between the surface of the substrate 1, the partitions 3D and 3B, and the window 4, as FIG. 5b shows.

The sixth and final manufacturing step is then carried out.

First of all a thermal treatment is applied under a vacuum, preferably better than $10^{-5}$ mbar, in an adapted enclosure, at a temperature as high as possible in taking account of the materials in place at that instant, for a duration enabling the degassing to be achieved of all the surfaces of the assembly: substrate, microbolometers, partitions, and window.

Before pressure increase to return to atmospheric pressure of the vacuum enclosure, a layer 10 is deposited, which is preferably metallic (for example of aluminum), of sufficient thickness to hermetically seal the openings 13 formed using the mask 9, as shown in FIGS. 6a and 6b. For this reason, the space between the upper surface of the layer 3, which serves as a support for the "seal", and the lower surface of the window 4, must be relatively small. This space is defined by the thickness of the layer 5C. Covering of the patterns 9 and 7 aims at avoiding the penetration of metallic materials inside the cavities. The deposition of this layer 10 will preferably be achieved by evaporation, according to known techniques (see for example "Vacuum Sealing of Microcavities using Metal Evaporation", by M. Bartek et al., Sensors and Actuators A61, pages 364 to 368, 1997).

Furthermore, having increased the pressure again, and before the sealing of the cavities, a gas of low thermal conductivity could advantageously be introduced, for example xenon, at low pressure. This makes it possible to moderate the specifications of rate of pressure increase over time, at the price of a moderate loss in performance.

The assemblies can then be brought back to atmospheric pressure, in order to proceed to the final operation, while the cavities remain under vacuum and are protected from the exterior environment.

The range of thicknesses proposed for window 4 (between about 0.1 $\mu$m and several $\mu$m) is sufficient to contain the effects of the exterior atmospheric pressure, when the technological process has been finished. More particularly, the density of the bearing points 3D and 3B is such that the resulting deformation of the window 4 between two bearing points is negligible, and this is all the more so in that the spacing between successive bearing points in the array is small.

This series of steps will be terminated by the etching, performed in known manner, of the layer 10 beyond the sealing zones, using a fifth lithographic mask 11. Aluminum will be very easily etched by acid chemical action, for example.

The window 4 bears on the partitions 3D and 3B to which it is joined. The volume enclosed between the substrate 1, the peripheral partition 3B and the window 4 is hermetically sealed from the exterior environment. Moreover, each cavity is isolated from the adjacent cavities.

Figure 1A:
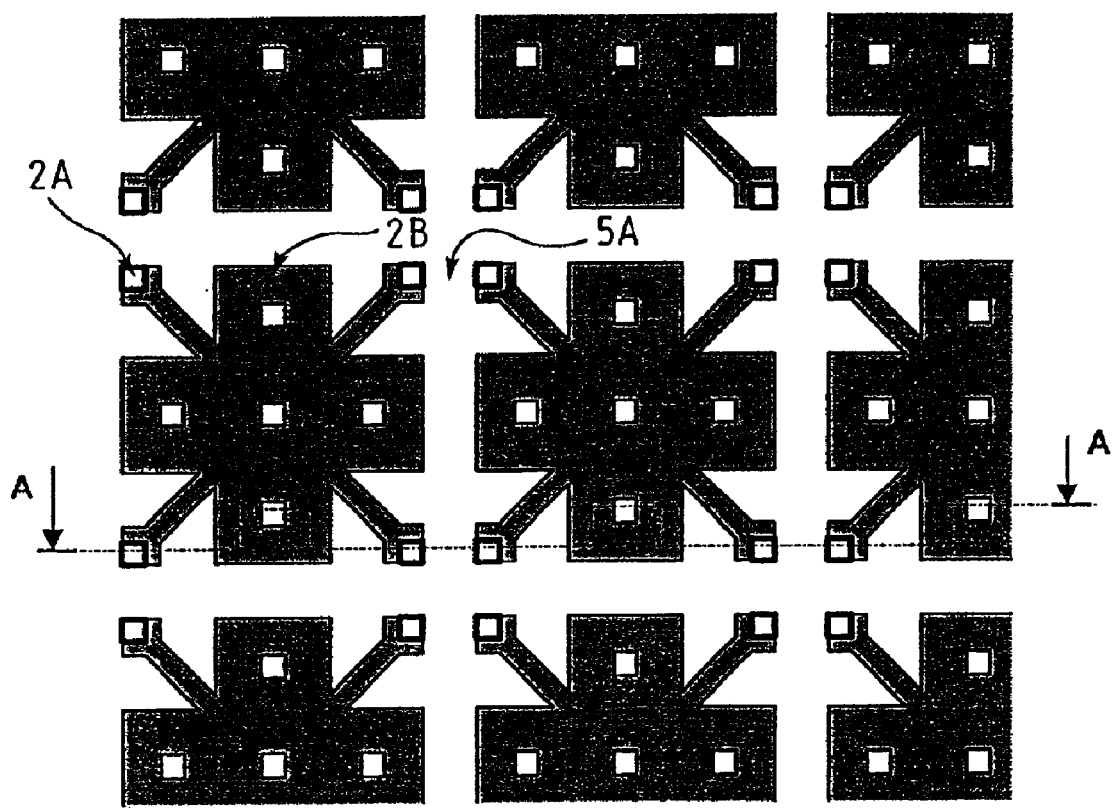
Figure 1B:
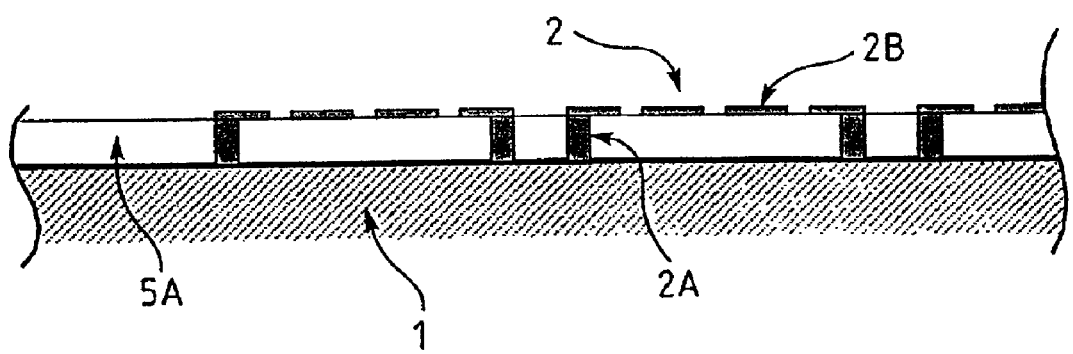
Figure 2A:
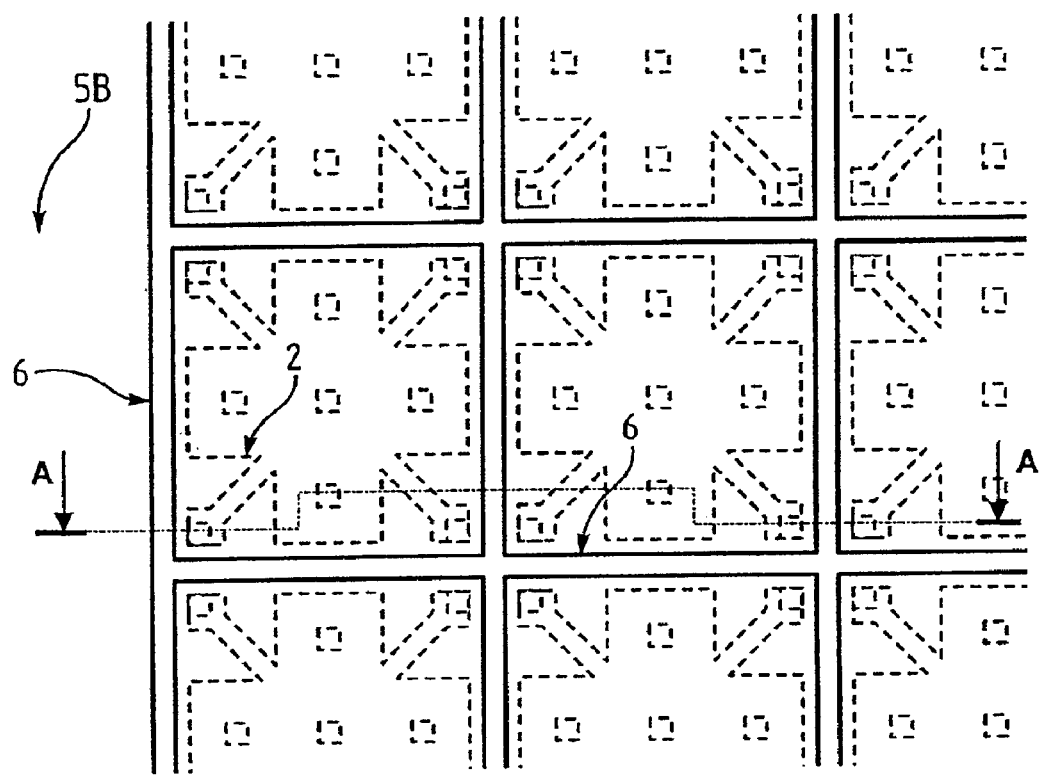
Figure 2B:
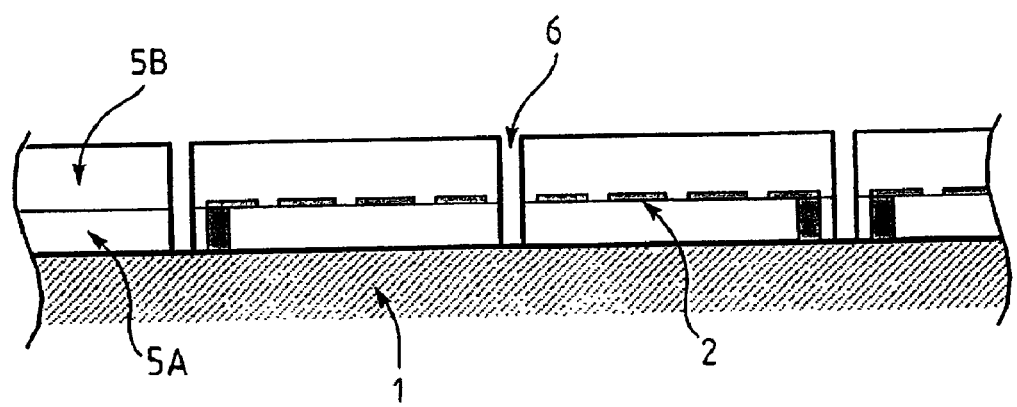
Figure 3A:
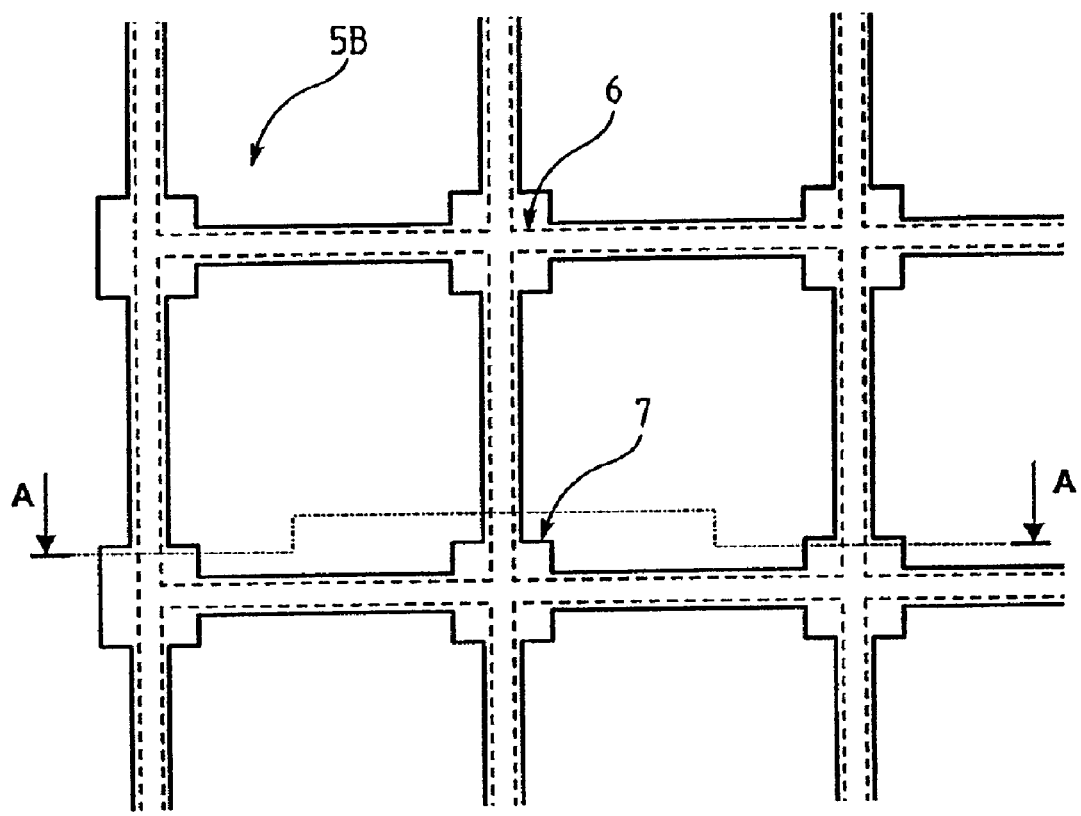
Figure 3B:
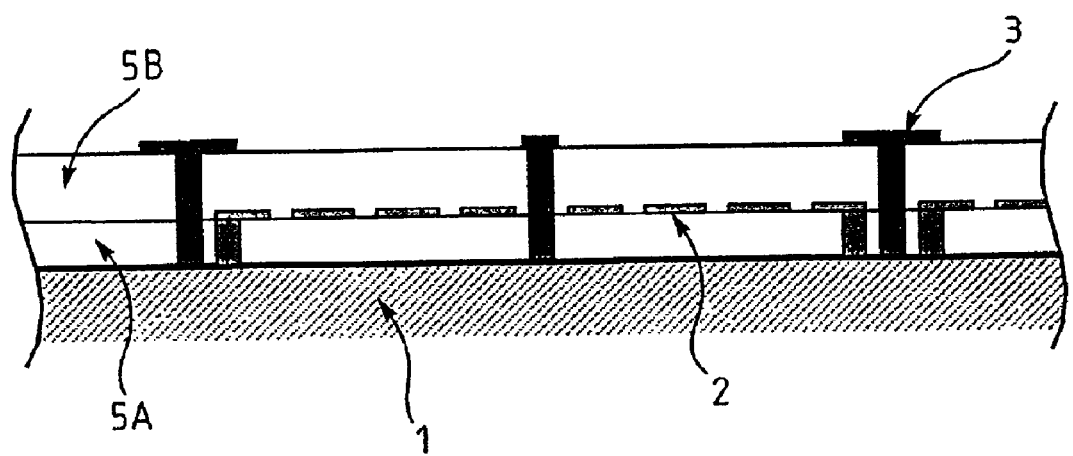
Figure 4A:
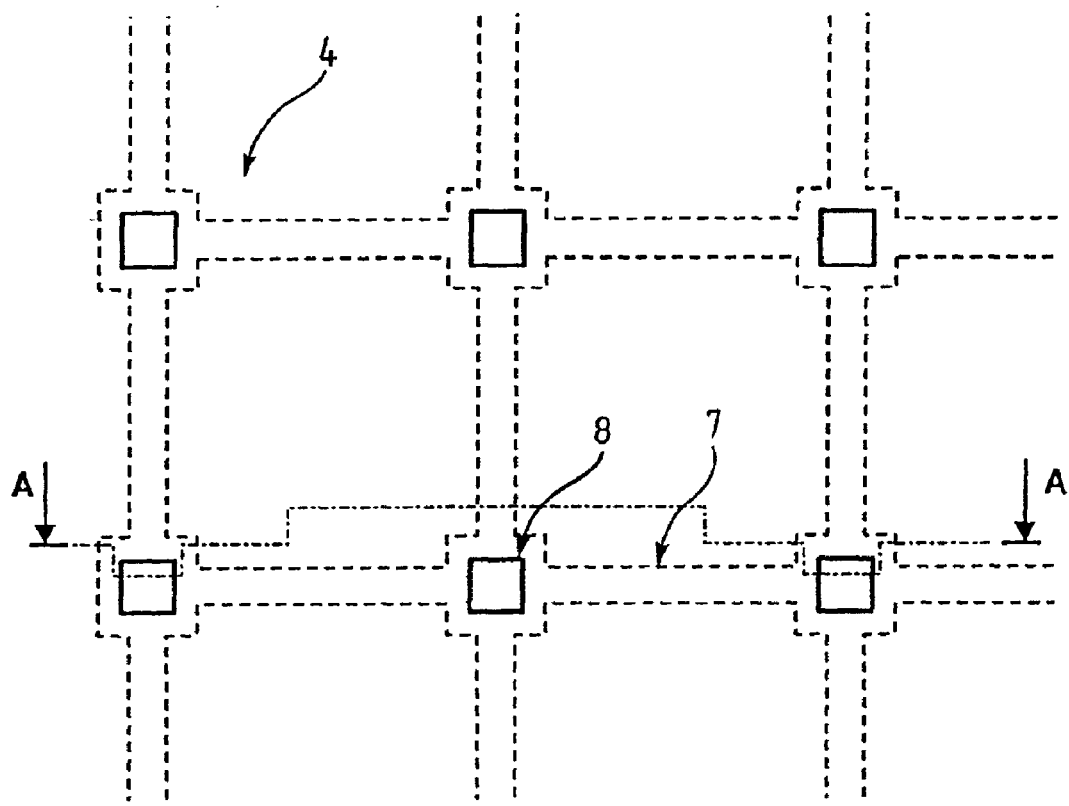
Figure 4B:
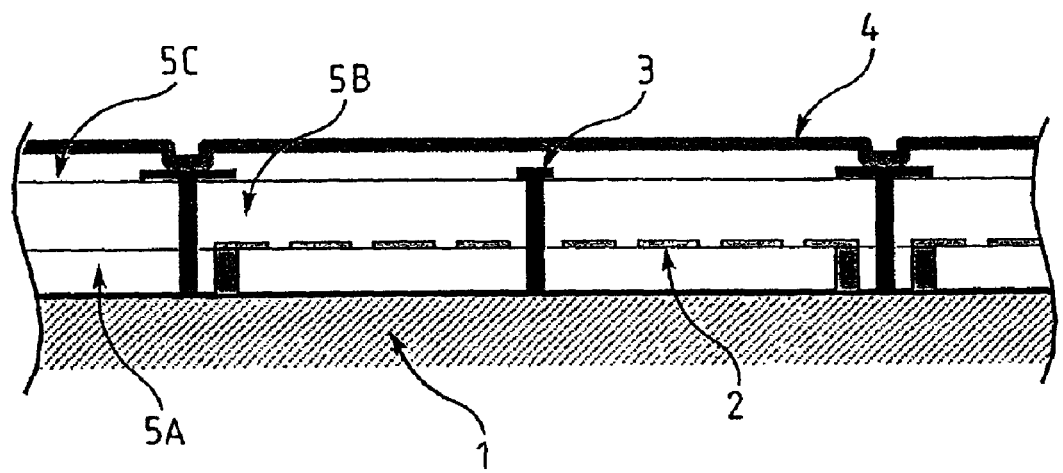
Figure 5A:
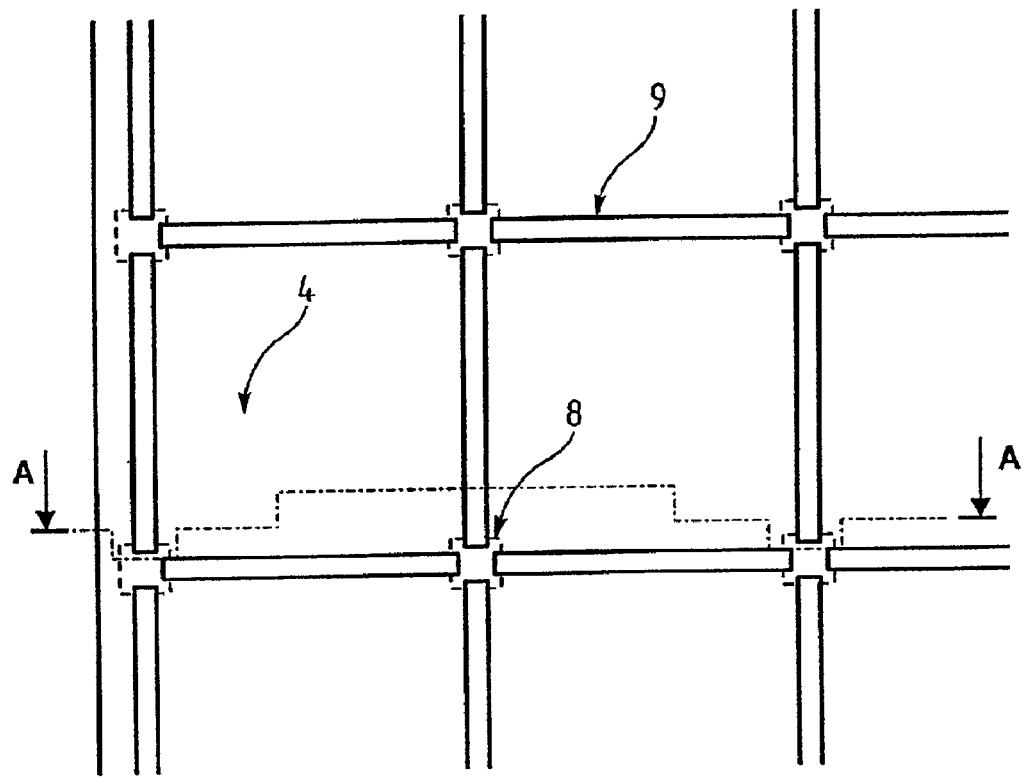
Figure 5B:
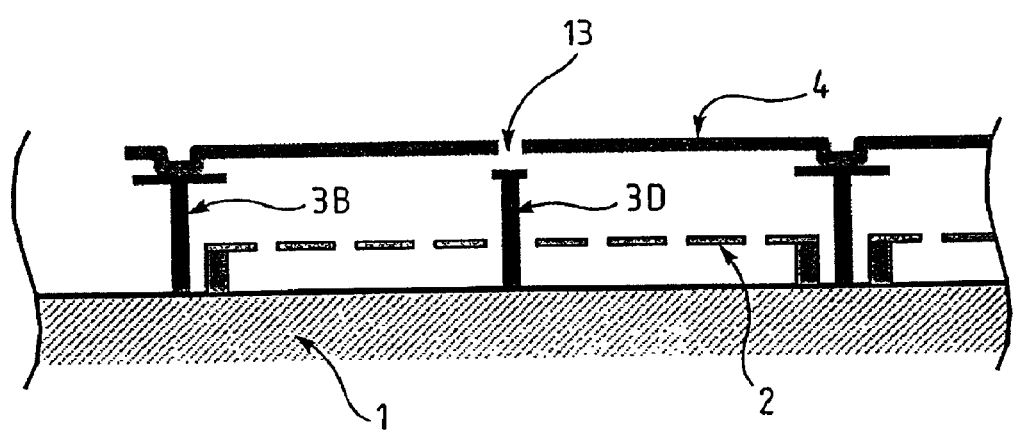
Figure 6A:
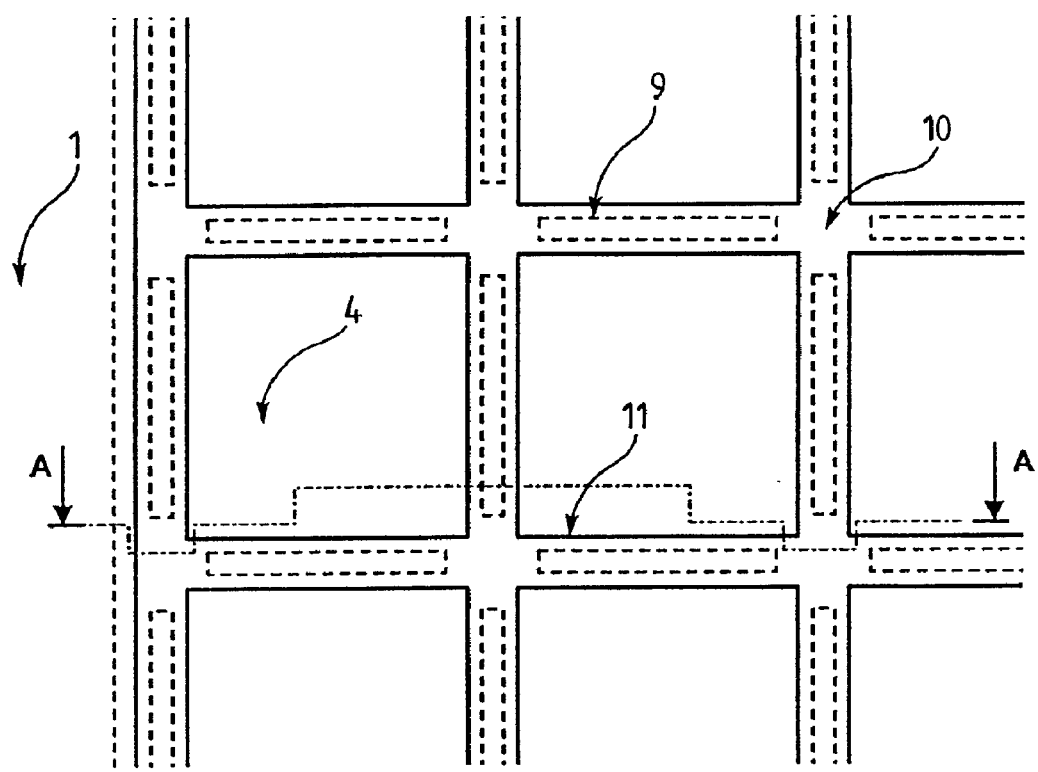
Figure 6B:
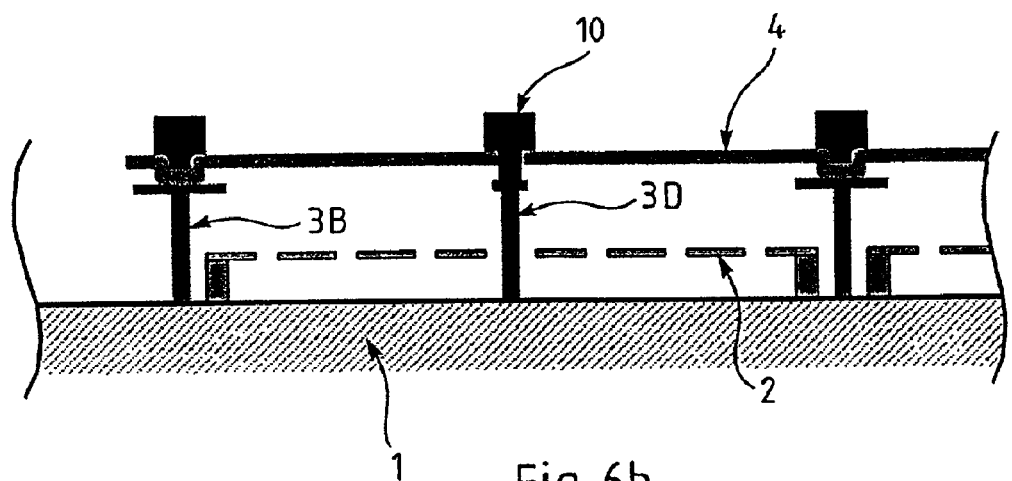
Figure 7:
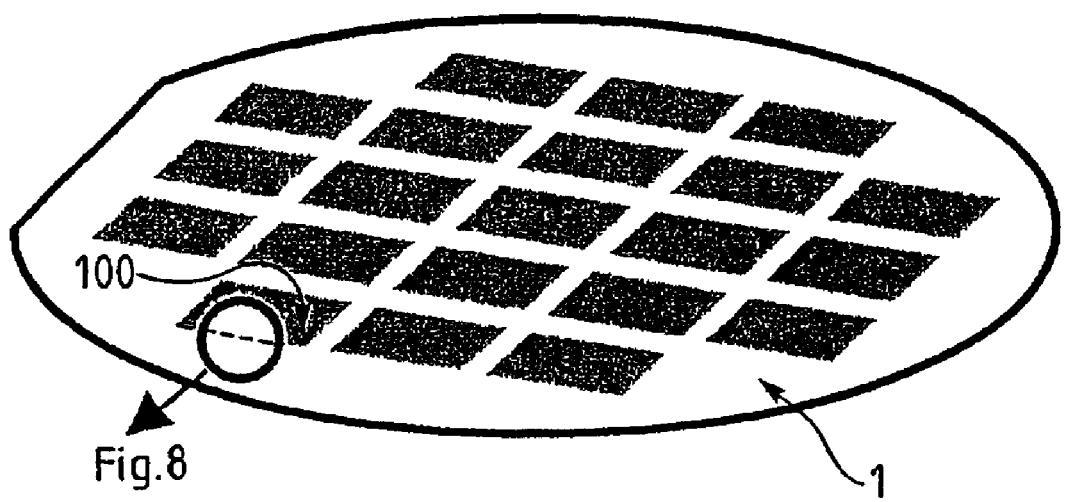
FIG. 7 shows a substrate 1 on which a certain number of detectors 100 have been constructed by following the steps described above.
Figure 8:
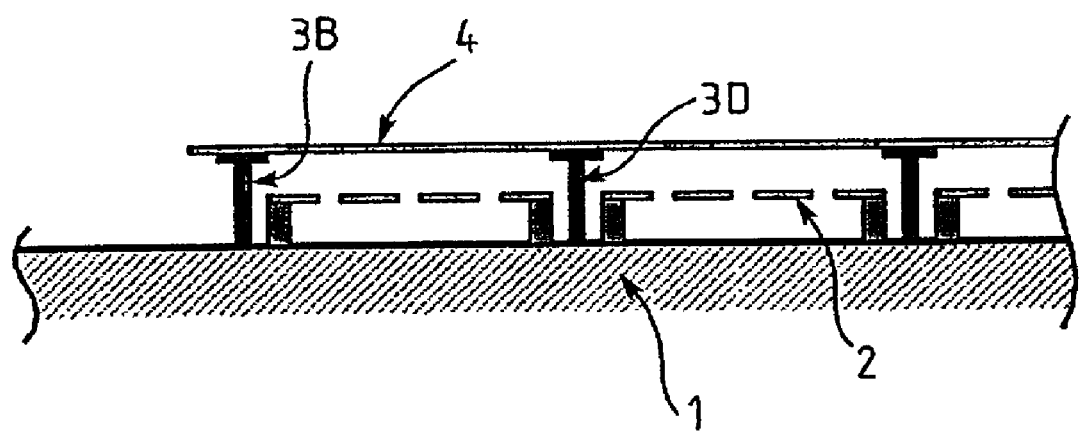
FIG. 8 is a cross-section of a detector 100 according to the invention, taken through a plane perpendicular to the substrate 1. The cross-section represents an edge of the detector, so as to illustrate among other things the corresponding structure.

In FIG. 8, each cavity contains a single microbolometer 2. However, as a function of the applications envisaged for the detectors 100, it would naturally be possible to locate the partitions 3D such that at least some of the cavities contain several microbolometers 2.

As the first embodiment of the invention is sufficiently defined in its essential steps, it is clear that the person skilled in the art could add various improvements or adaptations according to practical needs.

In particular, it would be possible to improve the durability of the interior vacuum if necessary by arranging to cover certain interior surfaces of the cavities with a conventional getter 12, deposited with conventional means.

It would be possible for example, on producing the microbolometers, to cover a part of the surface of the substrate 1 with such a material, within the cavity and in the immediate neighborhood of at least some of the microbolometers 2. If this arrangement is liable to disrupt the quality characteristics of the bolometers (in particular optical), these surfaces would be deposited preferably on zones that are partially or totally inactive optically, for example near the thermal insulation arms of the bolometers.

Figure 9A:
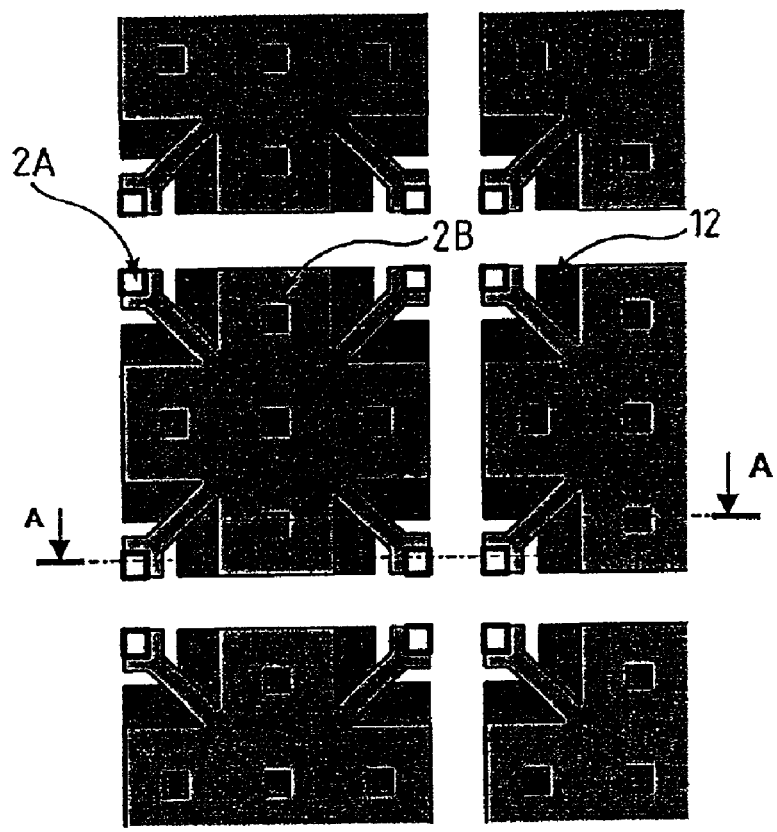
Figure 9B:
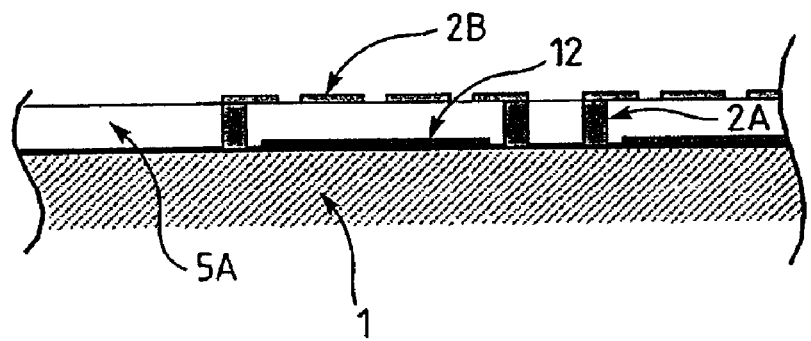

A second variant, shown in FIGS. 9a and 9b, consists in arranging these getters on virtually the entire surface of the substrate included in each cavity. This arrangement is in particular advantageous when the reflection coefficient of these elements in the infrared range is high, as is ordinarily the case for metals, including those which will make up the getter, to varying degrees. In fact, the use of infrared reflectors in microbolometer detectors is well known; this variant of the invention enables getters to be used as reflectors, in addition to their function of improving the vacuum.

Figure 10:
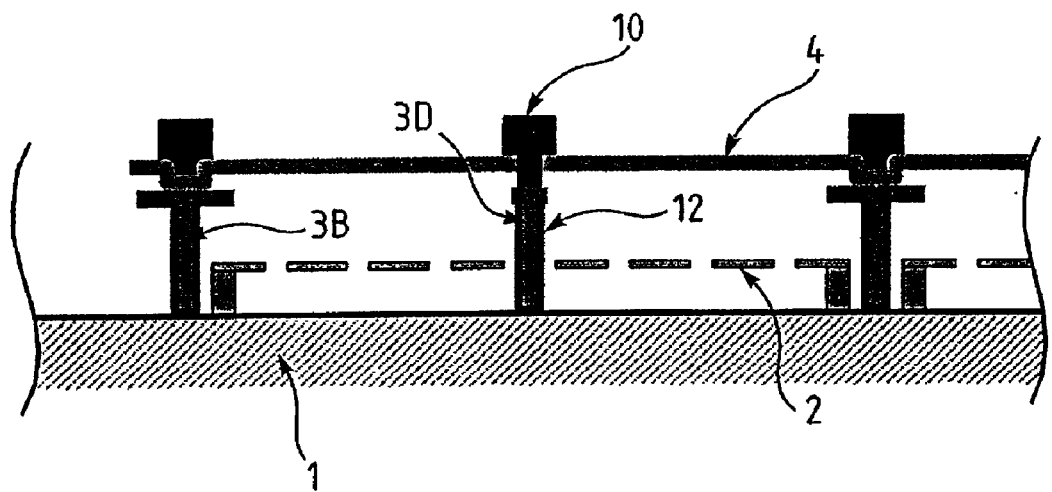

A third variant, illustrated diagrammatically in FIG. 10, consists in the arrangement of getters on at least a part of the partitions 3D and 3B. This arrangement makes it possible to dissociate the function "reflector" from the function "getter", that is to say to optimize them separately. According to this arrangement, the partitions 3D and 3B are constituted by a first layer of getter, which will cover the vertical and horizontal surfaces, then possibly other final layers adapted to improve the geometry, or the mechanical robustness, or the fluid-tightness of the partitions, or several of these properties simultaneously.

These variations, and particularly the last two, make it possible to ensure a ratio of getter surface/total cavity surface that is favorable to the maintenance of a vacuum of good quality, even for the very small volumes under consideration.

The essential steps in the manufacture of detectors according to a second embodiment of the invention will now be described.

The first step being, as has been stated, the same for the invention and for the prior art, we will begin immediately by describing the second step.

As in the first embodiment, a second sacrificial layer 5B is deposited first of all, of a material that is preferably identical, or at least analogous, to that of layer 5A. Preferably polyimide will be used, which will be re-cured in the usual manner in order to withstand the rest of the process. The thickness of this layer will preferably be of the order of 1 to 3 µm.

Next etching is carried out, in a manner that is preferably substantially vertical, of this layer 5B and the underlying layer 5A by conventional Reactive Ionic Etching means, using a first lithographic mask 6.

As has already been explained, it may be advantageous, for this operation, to use a hard mask (not shown). This hard mask could advantageously be left on the surface of the layer 5B for the rest of the operations.

As in the first embodiment, there is next deposited, over all of the structure, a layer 3 constituted by a mineral material (metallic or dielectric). It should be recalled that the thickness (preferably between 0.1 and 1 µm) and the nature of this material, as well as the method of deposition must be chosen so as to best fill the grooves. A stack of several layers of different kinds can also be used.

The mask 6 will preferably comprise at least one continuous linear opening that forms a closed figure, so as to trace the peripheral limits of the zones destined to constitute the detectors 200. The etching of the layer 5B will continue through the layer 5A, such that the peripheral motif produces a groove opening at the surface of the substrate 1.

Within each detector 200, the mask 6 is substantially constituted by patterns that are small (in relation to the dimensions of a bolometer) which are preferably formed directly in register with the support pillars 2A of the bolometers. In this manner, the final construction according to the invention has no effect either on the pre-existing structure of the bolometers, or on their performance. The etching of the layer 5B will be carried out until the tops of the pillars 2A are opened onto, such that the layer 3 subsequently comes into mechanical contact with these pillars.

Figure 11A:
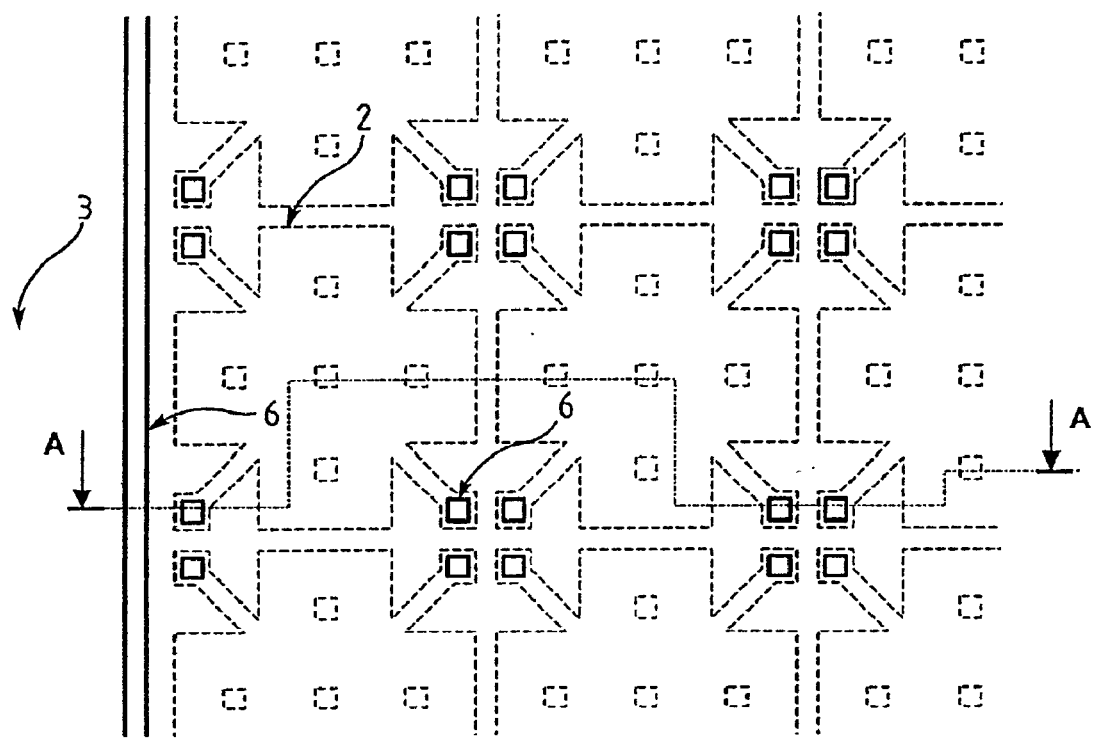
Figure 11B:
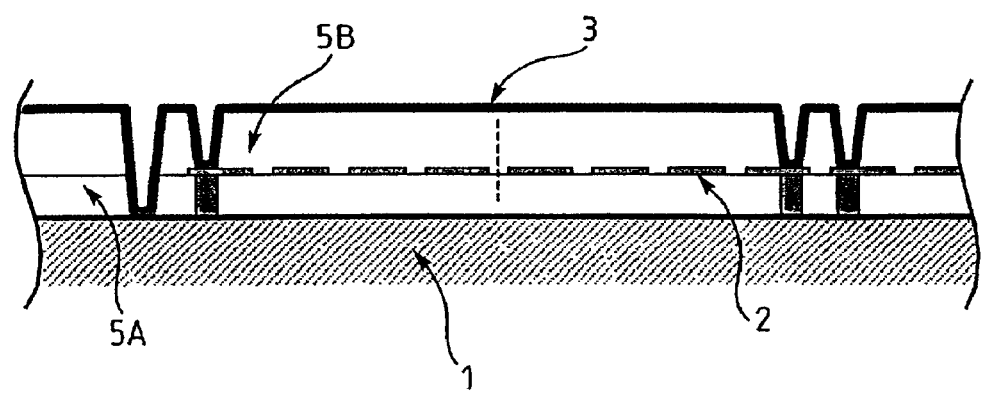

FIGS. 11a and 11b show respectively a view from above and a partial section of the assembly, after elimination of the lithographic mask 6 (and, if appropriate, of the hard mask).

The third manufacturing step is then proceeded to.

Figure 12A:
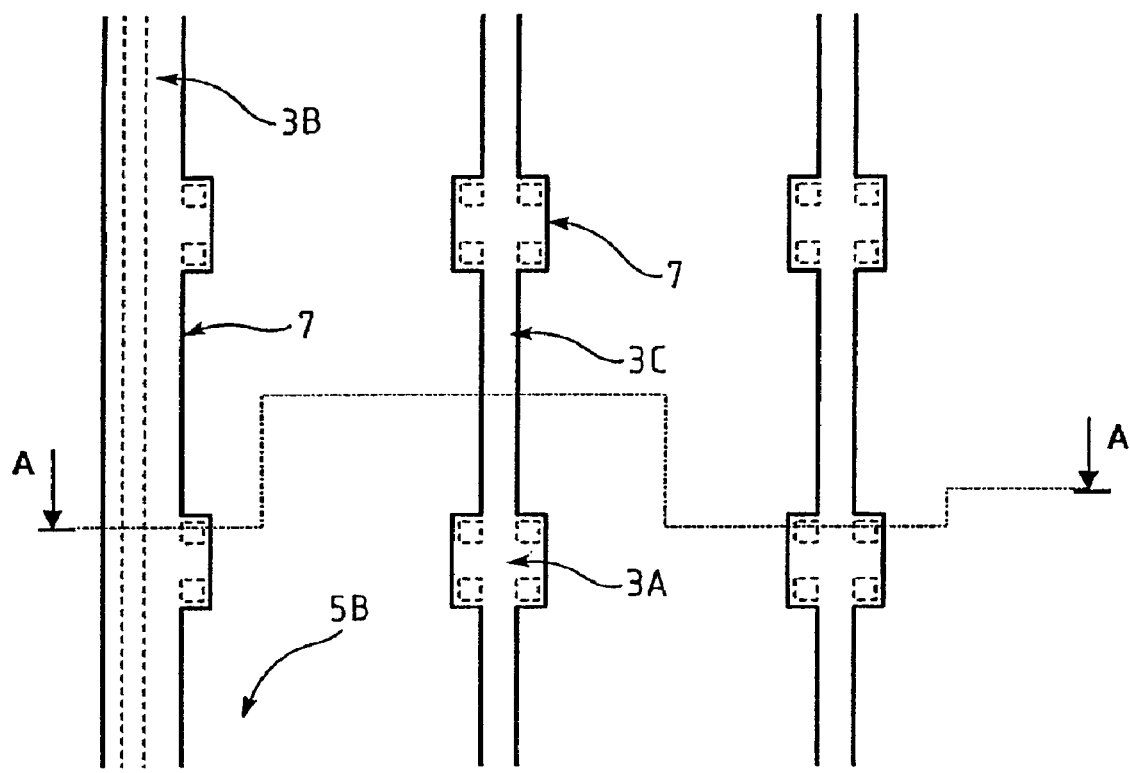

Layer 3 is first etched using a second lithographic mask 7, following a contour such as that shown on FIG. 12a.

Figure 12B:
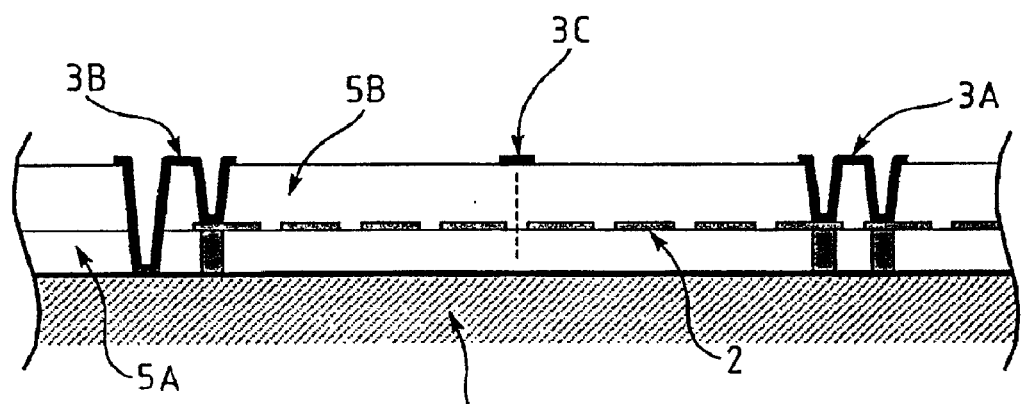

The residual pattern after etching is constituted by elements 3A of reduced extent (in relation to the surface of a bolometer) in each of which is included at least one opening 6 (see FIG. 11a) formed during the preceding operation, and elements 3C, substantially narrow and flat, of which the utility will become apparent below. All the patterns of the mask 7 within the detector will advantageously be arranged in register with the zones of the detector that are not optically sensitive, as there always exists, as for example in FIG. 12b. The person skilled in the art will know best how to arrange the zones 3A and 3C, as a function of the structure of the microbolometers, and to how to possibly adapt that structure to optimize the assembly. A linear and continuous pattern, 3B, will be traced at the array periphery, covering the linear pattern of the previous mask.

Beyond the periphery of the detector 200, the layer 3 will preferably be eliminated by etching, as shown.

If the hard mask of the preceding step has been kept, an easier stopping of the etching of layer 3 on layer 5B results from this. This third step will be terminated by the self-aligned etching of this hard mask, in order to clear the surface of the layer 5B.

The fourth manufacturing step is then carried out.

A third sacrificial layer 5C is deposited, of a material preferably identical, or at least analog, to that of the layers 5A and 5B, preferably of polyimide, which will also be re-cured in the usual manner in order to withstand the rest of the process. The thickness of this layer will preferably be of the order of 0.2 to 1 µm.

Figure 13A:
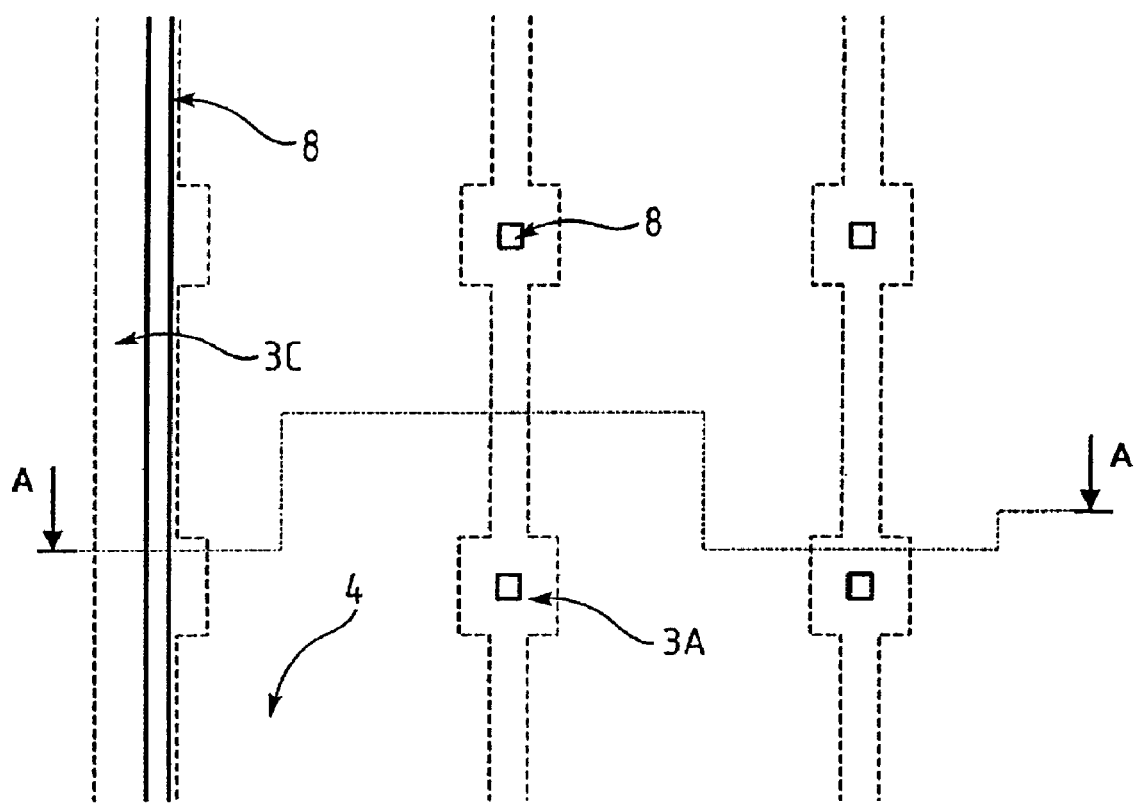

Next, this layer 5C is etched by RIE, using a third lithographic mask 8, of which the outline is shown on FIG. 13a.

This mask preferably has patterns of reduced extent within the detector 200, and, for each detector, at least one peripheral pattern that is linear and forms a closed figure. The small internal patterns will preferably be arranged within, or close to, the zones 3A. The peripheral pattern or patterns will also advantageously be arranged as shown in FIG. 13b, or close by.

Figure 13B:
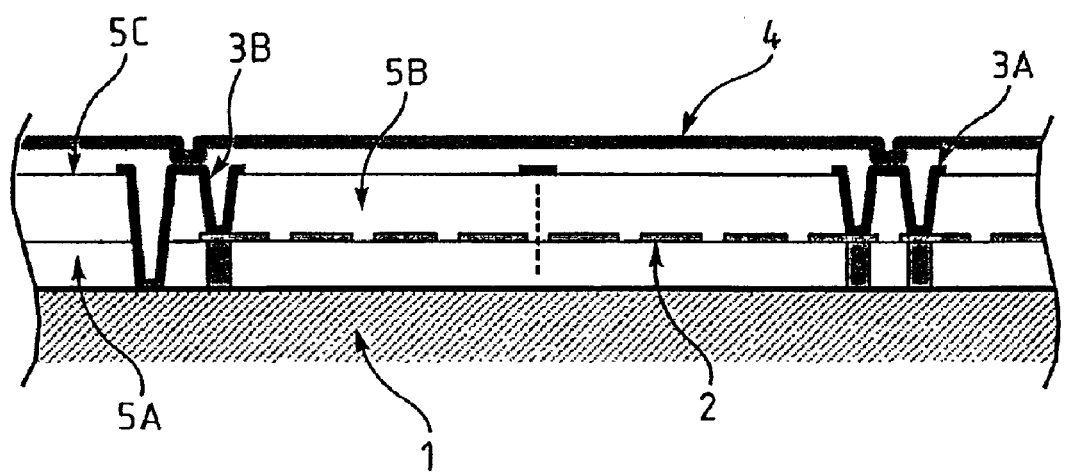

After elimination of the lithographic mask, a window 4 is deposited on the surface of layer 5C, as shown in FIG. 13b. The surfaces defined by the mask 8 constitute temporary bearing points for the window on the structure.

The material constituting the window 4 will naturally be appropriately chosen, as explained in relation to the first embodiment of the invention, and it is also possible here to optimize the device advantageously in positioning the window 4 at a height that is ideal from the point of view of the waves above the plane of the microbolometer 2.

The fifth manufacturing step is then proceeded to.

Figure 14A:
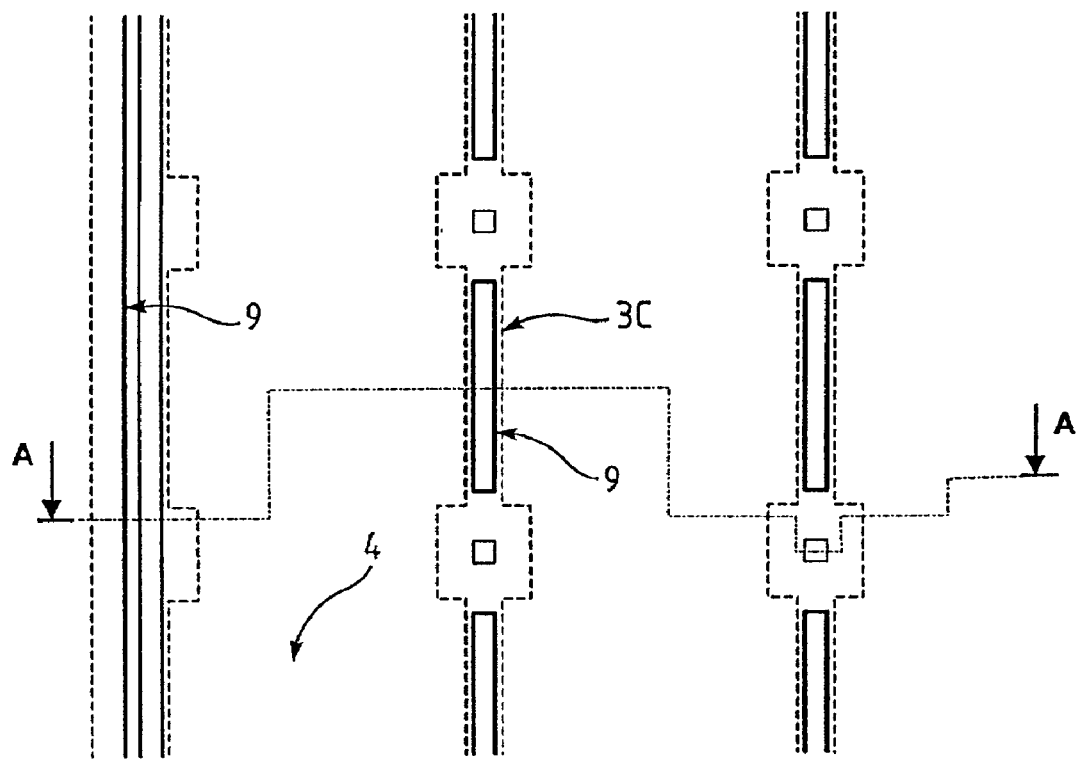

The window 4 is etched in known manner, using a fourth lithographic mask 9 shown on FIG. 14a. Preferably, window 4 will not extend beyond the periphery of the detectors 200.

Figure 14B:
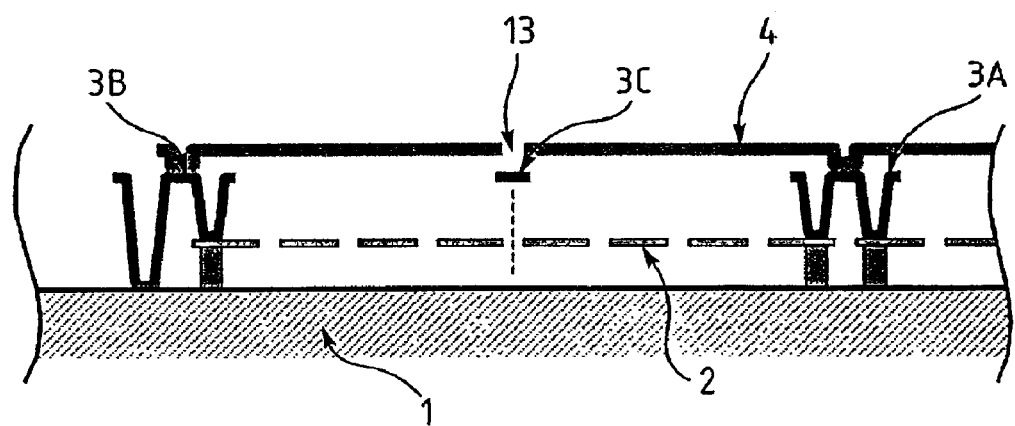

This mask 9 protects the window 4 over substantially all its surface, and defines openings 13 preferably situated above the zones 3C, as shown in FIG. 14b.

Next all the sacrificial polyimide layers 5A, 5B and 5C, are eliminated, as previously explained.

It should be noted that the zones 3B now form partitions surrounding the detector 200.

The openings 13 formed earlier using the mask 9 connect the exterior environment to the structures contained in the cavities defined between the surface of the substrate 1, the partitions 3B, and the window 4, as FIG. 14b shows.

The sixth and final manufacturing step is then proceeded to.

First of all a thermal treatment is applied under a vacuum, preferably better than $10^{-5}$ mbar, in an adapted enclosure, at a temperature as high as possible taking account of the materials in place at that instant, for a duration enabling the degassing to be achieved of all the surfaces of the assembly: substrate, microbolometers, partitions, and window.

Figure 15A:
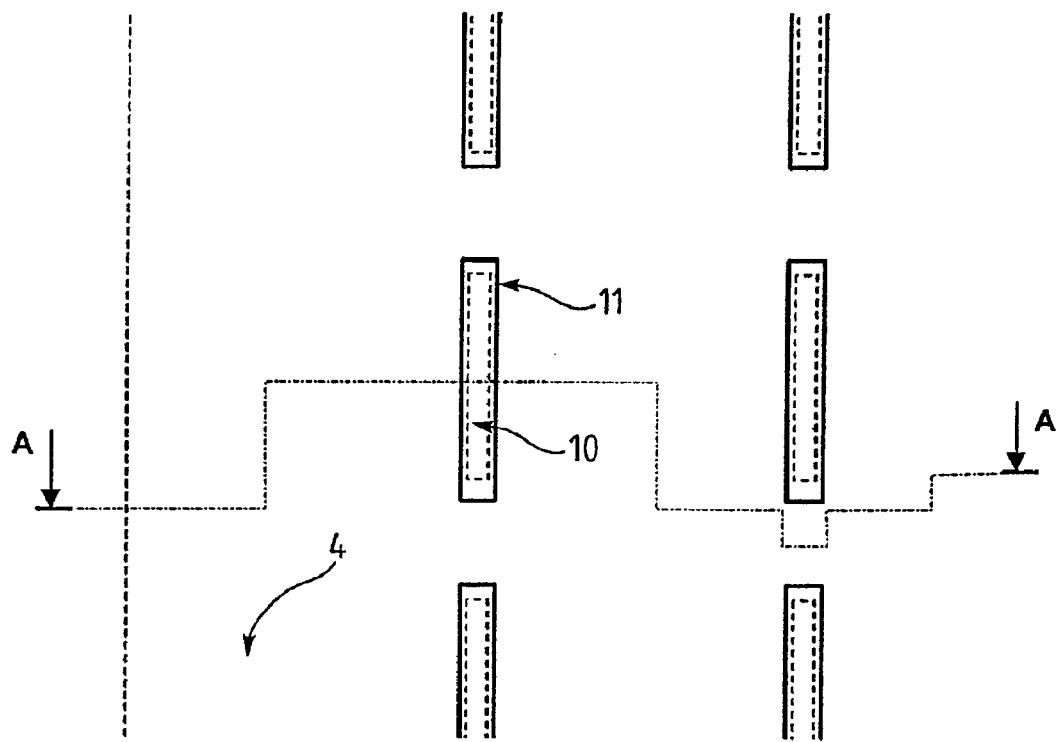
Figure 15B:
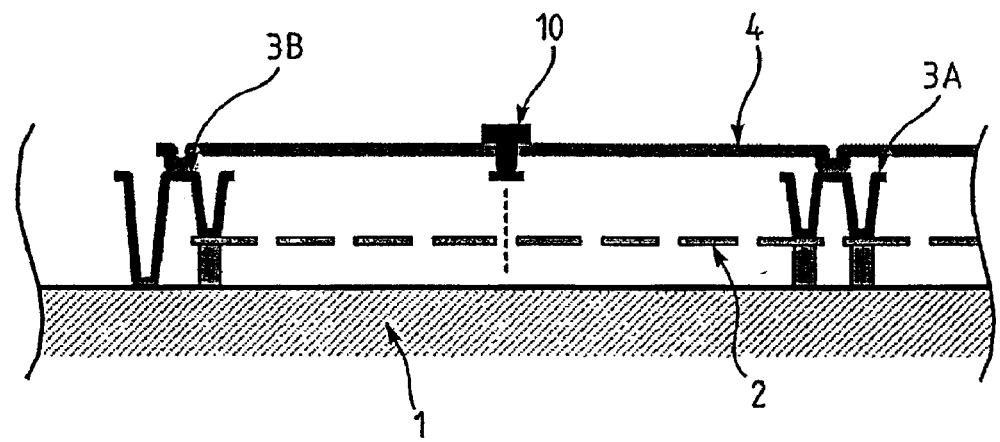

Before pressure increase to return to atmospheric pressure of the vacuum enclosure, a layer 10 is deposited, which is preferably metallic (for example of aluminum), and of sufficient thickness to hermetically seal the openings 13 formed using the mask 9, as FIGS. 15a and 15b show. For this reason, the space between the upper surface of the patterns 3C, which serves as a support for the "seals", and the lower surface of the window 4, must be relatively small. This space is defined by the thickness of the layer 5C. The inscription of the patterns 9 within the patterns 3C avoids the penetration of metallic materials inside the cavities. The deposition of this layer 10 will preferably be performed by metallic evaporation.

Furthermore, before increasing the pressure again, and before the sealing of the cavities, a gas of low thermal conductivity could advantageously be introduced as in the first embodiment, for example xenon, at low pressure.

The substrates can then be brought back to atmospheric pressure, in order to proceed to the final operation, while the cavities remain under vacuum and are protected from the exterior environment.

It will also be noted here that the range of thicknesses proposed for window 4 (between about 0.1 $\mu$m and several $\mu$m) is sufficient to contain the effects of the exterior atmospheric pressure, when the technological process has been finished. More particularly, the peripheral bearing 3B, and the density of the bearing points 3A within the detectors 200 are such that the resulting deformation of the window 4 between two bearing points is negligible.

Finally, a fifth lithographic mask 11 is used for the etching of the layer 10 beyond the sealing zones.

Figure 16:
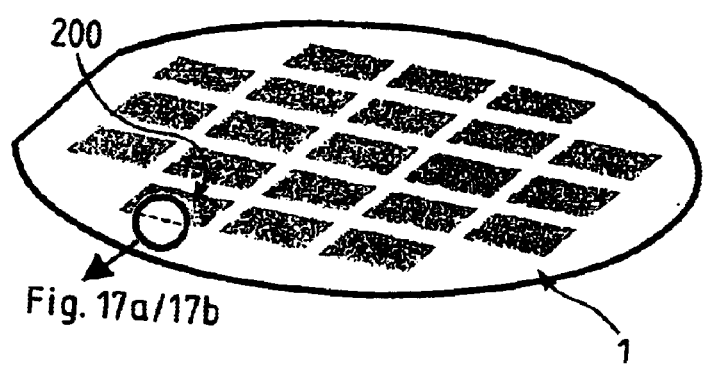

FIG. 16 shows a substrate 1 on which a certain number of detectors 200 have been constructed by following the steps described above.

Figure 17A:
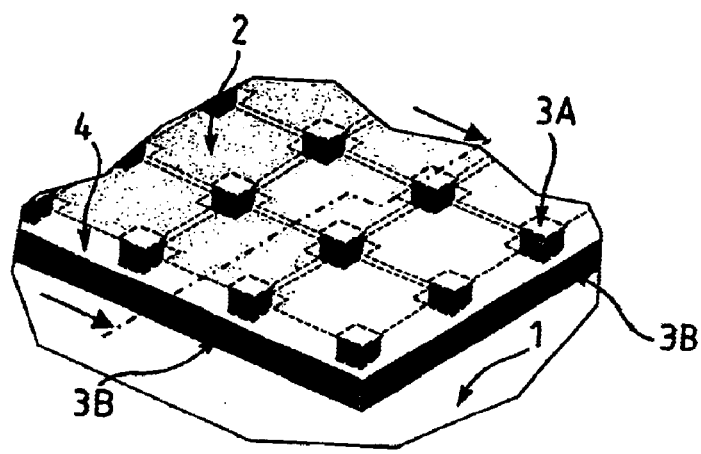
Figure 17B:
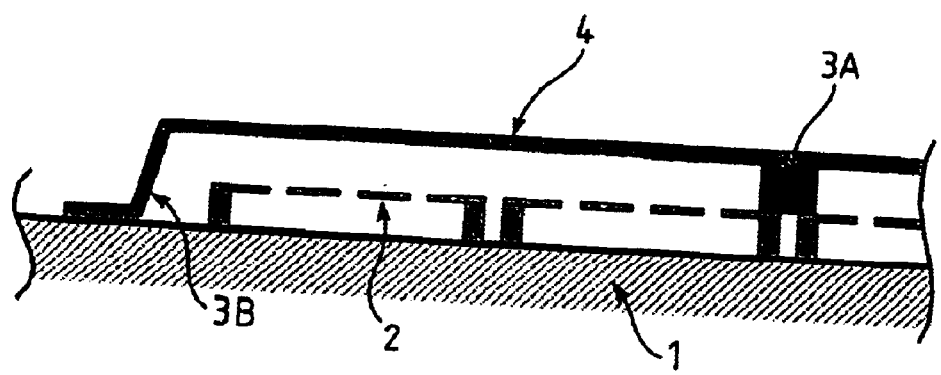

FIG. 17a is a perspective view of a detector 200 according to the invention, representing an edge of the detector, so as to illustrate, among other things, the corresponding structure. FIG. 17b is a cross-section on the line of dashes of FIG. 17a, taken along a broken plane that is perpendicular to the substrate 1.

The elements 3A form a dense network of pillars, substantially perpendicular to the substrate 1. These pillars 3A rest on the substrate 1 directly, or indirectly as shown in FIG. 17b.

The window 4 bears on the pillars 3A in the interior part of the detector 200, as well as on the peripheral partition 3B to which it is joined. This partition 3B will, generally, be constituted by one or more elements stacked up perpendicularly to the substrate and connected together. The volume enclosed between the substrate 1, the peripheral partition 3B and the window 4 is hermetically sealed from the exterior environment.

As in the first embodiment of the invention, it would be possible to improve the durability of the interior vacuum if necessary by arranging to cover certain interior surfaces of the cavities with a conventional getter 12, deposited with conventional means.

It would be possible for example, on producing the microbolometers, to cover a part of the surface of the substrate 1 with such a material, within the cavity and in the immediate neighborhood of at least some of the microbolometers (2). If this arrangement is liable to disrupt the quality characteristics of the bolometers (in particular optical), these surfaces would preferably be deposited on zones that are partially or totally inactive optically, for example near the thermal insulation arms of the bolometers, or on the spaces which separate the bolometers from each other.

Figure 18A:
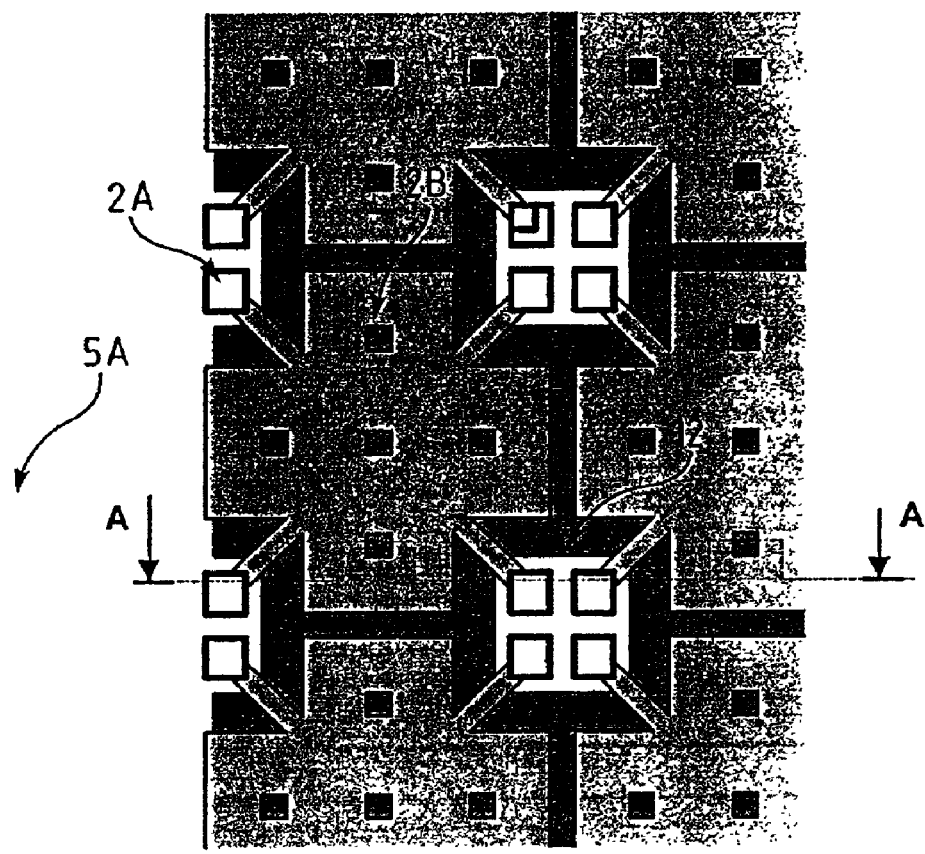
Figure 18B:
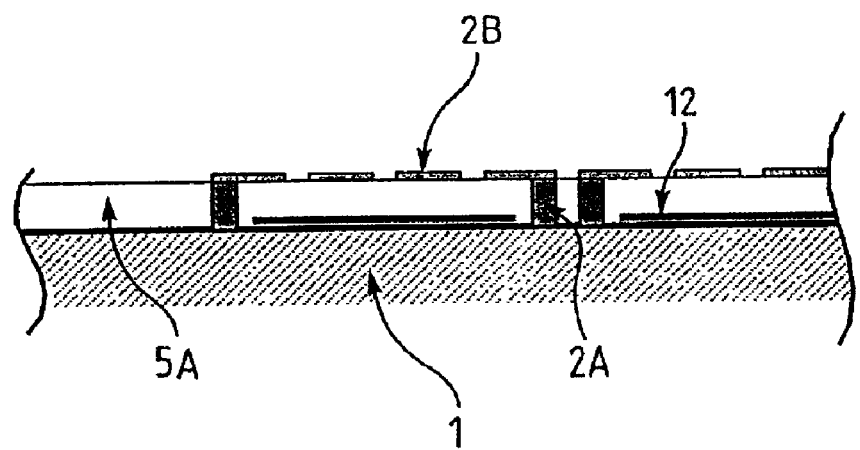

A second variant, shown in FIGS. 18a and 18b, consists in arranging these getters on virtually the entire surface of the substrate included in each cavity. It has been seen that this arrangement is notably advantageous when the reflection coefficient of these elements in the infrared range is high.

Figure 19:
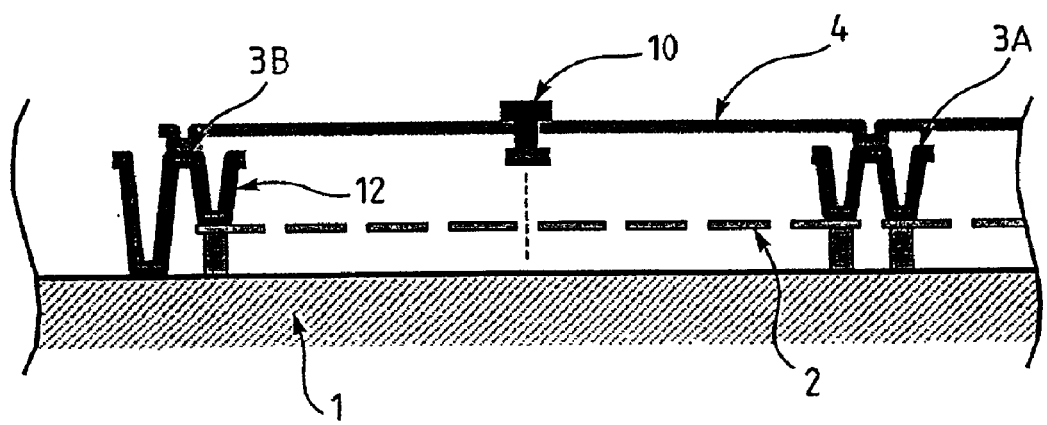

A third variant, illustrated diagrammatically in FIG. 19, consists in the arrangement of getters on at least a part of the partitions 3A and/or of the partition 3B and/or of the elements 3C. As has been explained, this arrangement makes it possible to dissociate the function "reflector" from the function "getter", that is to say to optimize them separately. According to this arrangement, the peripheral partition 3B is constituted by a first layer of getter, which will cover the vertical and horizontal surfaces, then possibly other final layers adapted to improve the geometry, or the mechanical robustness, or the fluid-tightness of the partitions, or several of these properties simultaneously.

As was explained in the introduction, when the manufacture of the detectors (100, 200) according to one of the embodiments of the invention described above, or according to another embodiment in accordance with the Claims hereto, is finished, the substrate is subjected to sorting operations of the circuits, then cutting up, cleaning, and, if appropriate, integration into simplified casings.

Figure 20:
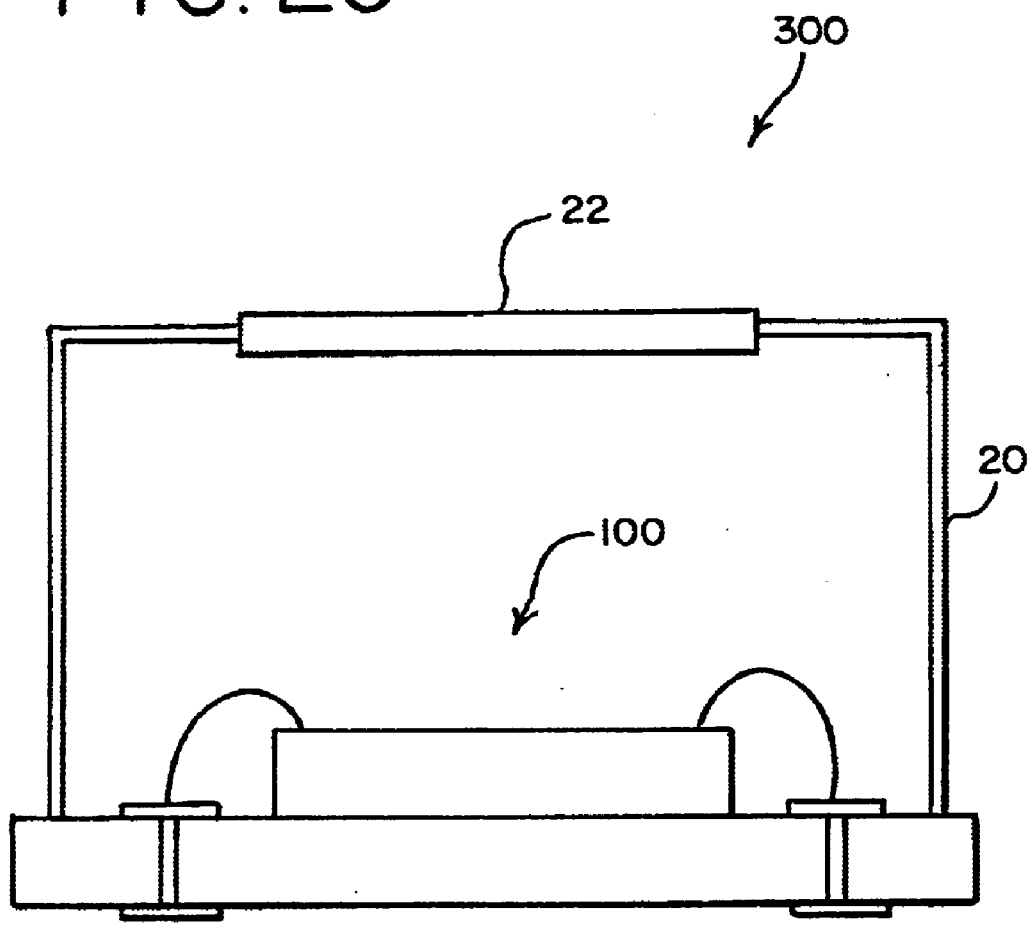

As illustrated in FIG. 20, a measurement or observation apparatus 300 incorporating at least one radiation detector 100 according to the invention is integrated by soldering or welding in a casing 20 provided with a window 22 that is transparent to the radiation that it is sought to detect (and possibly provided with Peltier modules for the thermal stabilization). The casing 20 is used like any casing of a conventional device adapted for the detection of radiation. Apparatus 300 may, for example, be part of an imaging systems operating in the infrared range.

In the above description, reference has been made to bolometers to establish the ideas, but it is clear that the detectors concerned by the invention may be multiple in nature, and not only bolometers, that the range of wavelengths which they may detect is in no way limited to the infrared range, and that the applications for these detectors concerns multiple fields (spectroscopy, for example), and not only imaging. In particular, all radiation detectors requiring structures of "large" dimension, such as MEMS (Micro-Electro-Mechanical Systems), to be placed in a vacuum, could benefit from the invention, in its various aspects.

What is claimed is:

1. A method of manufacturing radiation detectors collectively on a substrate in which said radiation detectors each comprise an assembly of microdetectors under a window that is transparent to radiation, said method comprising:

forming a plurality of layers, wherein for each of said radiation detectors at least one of said plurality of layers is transparent to said radiation and serves as a window; and partially eliminating at least a portion of said plurality of layers principally under said transparent layer, such that said microdetectors are positioned, for each of said radiation detectors, in one or more cavities; and placing said one or more cavities under sub-atmospheric pressure.

2. A method of manufacture according to claim 1, further comprising formatting of a peripheral partition surrounding each of said radiation detectors.

3. A method of manufacture according to claim 1, wherein partially eliminating at least a portion of said plurality of layers comprises a process carried out through one or more openings formed in the vicinity of each of said microdetectors.

4. A method of manufacture according to claim 3, wherein placing said one or more cavities under sub-atmospheric pressure comprises a process carried out through said one or more openings, and wherein a surface is formed within said one or more cavities opposite each of said one or more openings that supports a material capable of sealing said one or more openings and said one or more cavities.

5. A method of manufacture according to claim 3, wherein for at least one of said one or more cavities, said openings are formed in said transparent layer.

6. A method of manufacture according to claim 5, wherein placing said one or more cavities under sub-atmospheric pressure comprises a process carried out through said one or more openings, and wherein a surface is formed within said one or more cavities opposite each of said one or more openings that supports a material capable of sealing said one or more openings and said one or more cavities.

7. A radiation detector manufactured by means of a method according to claim 1.

8. A radiation detector according to claim 7, wherein selected internal surfaces of said cavities are covered with a getter.

9. A radiation detector according to claim 8, wherein said selected internal surfaces comprise a portion a surface of said substrate in proximity to at least one of said assembly of microdetectors.

10. A radiation detector according to claim 8, wherein said selected internal surfaces comprise the entire surface of said substrate within each of said cavities.

11. A radiation detector according to claim 7, wherein said radiation detector further comprises a peripheral partition and a network of internal partitions, said window being joined to said peripheral partition and to said network of internal partitions, and wherein said microdetectors are suspended in said one or more cavities by columnar pillars.

12. A radiation detector according to claim 11, wherein at least a portion of said peripheral partitions and a portion of said are network of internal partitions covered with a getter.

13. A radiation detector according to claim 7 further comprising a folded peripheral partition and a network of internal pillars, said window being joined to said folded peripheral partition and to said network of internal pillars.

14. A radiation detector according to claim 13, wherein at least a portion of said folded peripheral partition is covered with a getter.

15. A radiation detector according to claim 14, wherein said assembly of microdetectors comprises assembly of microbolometers.

16. A radiation detector according to claim 13, wherein said at least a portion of said internal pillars, or at least a portion of said peripheral partition, or both, are covered with a getter.

17. A radiation detector according to claim 7, wherein said radiation detector is integrated by a solder bond or by glue into a casing provided with a window transparent to said radiation.

18. An apparatus selected from the group consisting of a measurement apparatus or an observation apparatus, the apparatus comprising at least one radiation detector according to claim 7.

* * * * *